(12) United States Patent
Johnson et al.

(10) Patent No.: US 7,229,705 B1
(45) Date of Patent: Jun. 12, 2007

(54) MISCHMETAL OXIDE TBC

(75) Inventors: Lyman A. Johnson, deceased, late of Cincinnati, OH (US); by Mary B. Johnson, legal representative, Cincinnati, OH (US); Robert W. Bruce, Loveland, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/465,288

(22) Filed: Aug. 17, 2006

Related U.S. Application Data

(62) Division of application No. 10/792,161, filed on Mar. 3, 2004, now Pat. No. 7,175,888.

(51) Int. Cl.
*B32B 9/00* (2006.01)
*F03B 3/12* (2006.01)

(52) U.S. Cl. .................. 428/701; 428/688; 428/689; 428/699; 428/702; 428/697; 416/241 B; 416/241 R

(58) Field of Classification Search .................. None
See application file for complete search history.

(56) References Cited

U.S. PATENT DOCUMENTS

| | | | |
|---|---|---|---|
| 4,156,623 A | 5/1979 | Becker | |
| 4,347,082 A | 8/1982 | Osumi et al. | |
| 4,447,503 A | 5/1984 | Dardi et al. | |
| 4,448,748 A | 5/1984 | Radtke et al. | |
| 4,503,128 A | 3/1985 | Iseli et al. | |
| 4,590,090 A | 5/1986 | Siemers et al. | |
| 4,913,961 A | 4/1990 | Jones et al. | |
| 5,264,634 A | 11/1993 | Becker et al. | |
| 5,277,936 A | 1/1994 | Olson et al. | |
| 5,418,003 A | 5/1995 | Bruce et al. | |
| 5,455,119 A | 10/1995 | Taylor et al. | |
| 5,499,905 A | 3/1996 | Schmitz et al. | |
| 5,504,195 A | 4/1996 | Leedham et al. | |
| 5,538,796 A | 7/1996 | Schaffer et al. | |
| 5,698,273 A | 12/1997 | Azad et al. | |
| 5,961,750 A | 10/1999 | Boffito et al. | |
| 5,993,980 A | 11/1999 | Schmitz et al. | |
| 6,015,630 A | 1/2000 | Padture et al. | |
| 6,145,470 A | 11/2000 | Bruce et al. | |
| 6,194,083 B1 | 2/2001 | Yasuda et al. | |
| 6,342,278 B1 | 1/2002 | Rigney et al. | |
| 6,589,351 B1 | 7/2003 | Bruce et al. | |
| 6,620,465 B2 | 9/2003 | Rigney et al. | |

(Continued)

FOREIGN PATENT DOCUMENTS

JP 55115919 9/1980

(Continued)

*Primary Examiner*—Jennifer McNeil
*Assistant Examiner*—Elizabeth D. Ivey
(74) *Attorney, Agent, or Firm*—McNees Wallace & Nurick LLC

(57) ABSTRACT

The present invention is a turbine engine component comprising a superalloy substrate, a bond coat overlying the substrate having a thickness in the range of about 0.0005 inch to about 0.005 inch, a thin alumina scale overlying the bond coat, and a thermal barrier coating (TBC) overlying the thin alumina scale, the TBC having a thickness in the range of about 0.0025 inch to about 0.010 inch, and comprising at least mischmetal oxide.

8 Claims, 7 Drawing Sheets

U.S. PATENT DOCUMENTS 6,730,422 B2 * 5/2004 Litton et al. ................ 428/701

FOREIGN PATENT DOCUMENTS

| JP | 62017168 | 1/1987 |
| JP | 06136461 | 5/1994 |
| JP | 07145407 | 6/1995 |
| JP | 08337803 | 12/1996 |
| JP | 10087326 | 4/1998 |
| JP | 2000087208 | 3/2000 |
| WO | 0006796 | 2/2000 |

* cited by examiner

MISCHMETAL OXIDE TBC

This application is a Divisional of U.S. patent application Ser. No. 10/792,161, filed Mar. 3, 2004 now U.S. Pat. No. 7,175,888, the entire contents of which are incorporated herein by reference in their entirety.

FIELD OF THE INVENTION

The present invention relates to thermal barrier coatings for components exposed to high temperatures, such as the hostile thermal environment of a gas turbine engine. More particularly, this invention is directed to thermal barrier coatings comprising mischmetal oxide.

BACKGROUND OF THE INVENTION

Higher operating temperatures for gas turbine engines are continuously sought in order to increase their efficiency. However, as operating temperatures increase, the high temperature durability of the components of the engine must correspondingly increase. While significant advances have been achieved with iron, nickel and cobalt-base superalloys, the high-temperature capabilities of these alloys alone are often inadequate for components located in certain sections of a gas turbine engine, such as the turbine, combustor and augmentor. A common solution is to thermally insulate such components in order to minimize their service temperatures. For this purpose, thermal barrier coatings (TBC) formed on the exposed surfaces of high temperature components have found wide use.

To be effective, thermal barrier coatings must have low thermal conductivity and adhere well to the component surface. Various ceramic materials have been employed as the TBC, particularly yttria ($Y_2O_3$) stabilized zirconia ($ZrO_2$), commonly known as YSZ. This material is widely employed in the art because it can be readily deposited by plasma spray and vapor deposition techniques. In addition, YSZ has good erosion and impact resistance. An example of the latter is electron beam physical vapor deposition (EB-PVD), which produces a thermal barrier coating having a columnar grain structure that is able to expand with its underlying substrate without causing damaging stresses that lead to spallation, and therefore exhibits enhanced strain tolerance. The component is supported in proximity to an ingot(s) of the ceramic coating material (e.g., YSZ in a vacuum), and an electron beam is projected onto the ingot(s) so as to melt the surface of the ingot and produce a vapor of the coating material that deposits onto the component. Such EB-PVD deposited TBCs are generally deposited to a thickness in the range of about 0.005 inch to about 0.010 inch. Adhesion of the TBC to the component is often further enhanced by the presence of a metallic bond coat, such as a diffusion aluminide or an oxidation-resistant alloy such as MCrAlX, where M is iron, cobalt and/or nickel, and where X is yttria and/or another rare earth oxide However, the application of a TBC by the EB-PVD process is expensive and time consuming due to the thickness of the coating. Also, maintenance of the EB-PVD apparatus is performed as a function of operation of the apparatus, so fewer parts having a thick coating can be processed in the period of time between maintenance operations. In addition, the thickness of the coating increases the load on the coated part in a high acceleration G-load environment, particularly for TBC coated blades in a high pressure turbine. One of the properties of the TBC that determines the required thickness of the TBC is the thermal conductivity of the TBC, since a coating with lower thermal conductivity does not have to be as thick as a coating with higher thermal conductivity in order to obtain the same thermal protection for the substrate. Developments in the past have led to TBCs with lower thermal conductivity simply by changing the manner in which the TBC is applied using EB-PVD.

One such method is set forth in U.S. Pat. No. 6,620,465 ('465) to Rigney et al. and assigned to the assignee of the present invention. The '465 patent is directed to a method of improving the thermal conductivity of the TBC resulting from an EB-PVD by moving the article to be coated further from the ingot or source of ceramic material.

In view of the above, there is considerable motivation to further reduce the thickness of the TBC through the use of materials that are lower in thermal conductivity. However, limitations of the prior art are often the result of the relatively narrow range of acceptable and readily available materials. Accordingly, new materials for use in the EB-PVD process are continuously being sought for depositing coatings, and particularly ceramic coatings such as TBCs.

What is needed is a new type of material for use in the EB-PVD process that has lower thermal conductivity, better erosion resistance, and/or better impact resistance than presently available TBC materials and is processible for use in TBC materials. In particular, a material is needed that has a lower thermal conductivity, and at least comparable erosion resistance, and/or impact resistance as YSZ.

SUMMARY OF THE INVENTION

The present invention is a turbine engine component comprising a superalloy substrate, a bond coat overlying the substrate having a thickness in the range of about 0.0005 inch to about 0.005 inch, a thin alumina scale overlying the bond coat, and a thermal barrier coating (TBC) overlying the thin alumina scale, the TBC having a thickness in the range of about 0.0025 inch to about 0.010 inch, and comprising at least mischmetal oxide.

The present invention is a turbine engine component comprising a superalloy substrate, a bond coat overlying the substrate having a thickness in the range of about 0.0005 inch to about 0.005 inch, a thin alumina scale overlying the bond coat, and a TBC overlying the thin alumina scale, the TBC having a thickness in the range of about 0.0025 inch to about 0.010 inch, and a plurality of layers, wherein at least one of the layers comprises at least mischmetal oxide.

As is known in the art, most rare earth oxides are found in one type of ore, commonly known as mischmetal ore, which, once mined, is cleaned and then smelted to a mixture of rare-earth metals, such as cerium (Ce), lanthanum (La), praseodymium (Pr), and neodymium (Nd), and impurities. This mixture of metals is commonly known as "mischmetal." As used herein the term "mischmetal" refers to clean mischmetal ore as known in the art. As used herein the term "mischmetal oxide" means oxidized clean mischmetal ore as known in the art that is obtained by oxidizing clean mischmetal. The specific combination of rare earth metals in the mischmetal ore varies depending on the mine and vein from which the ore was extracted. Mischmetal generally has a composition, based on 100% of weight, of about 30% to about 70% Ce by weight, about 19% to about 56% La by weight, about 2% to about 7% Pr by weight and from about 0% to about 20% Nd by weight, and impurities. Mischmetal is often refined to its individual rare-earth metals constituents. The present invention uses mischmetal, which has not been separated and refined into its individual metal constituents, as a source of oxides for the deposition of TBC by EB-PVD, such that the TBC comprises the rare earth oxides present in mischmetal.

The present invention is also a method for the application of a mischmetal oxide TBC to a superalloy turbine engine component including the steps of providing an electron beam physical vapor deposition apparatus, providing a turbine engine component comprising a surface to be coated, providing a first mischmetal ingot, and providing a second ingot comprising another oxide material selected from the group consisting of yttria-stablized zirconia, zirconia, yttria, hafnia, at least one other rare earth oxide, and combinations thereof. The component and the ingots are placed in to the apparatus as known in the art. Melt pools are formed on the ingots by the electron beam as known in the art. The mischmetal is then oxidized by bleeding a small controlled amount of oxygen into the EB-PVD apparatus. Mischmetal oxide vapors and other oxide vapors are then dispersed as known in the art. The mischmetal oxide vapors and the yttria-stabilized vapors are then deposited onto the surface to be coated. The deposition process forms a TBC having a thickness in the range of about 0.0025 inch to about 0.010 inch. Thicker TBCs provide enhanced thermal protection.

As is known in the art, thermal conductivity is calculated by the following equation:

$$k = \alpha \rho C_p$$

where k is thermal conductivity (W/m/K), $\alpha$ is thermal diffusivity (cm$^2$/s), $\rho$ is density (g/cm$^3$), and $C_p$ is specific heat (W·s/g/K). The higher the thermal conductivity of a TBC material, the thicker the TBC has to be, as the purpose of the TBC is to resist heat transfer of heat from the hot gases of combusting into the underlying superalloy substrate. Preferably, the thermal conductivity of the TBC should be lower so that a thinner TBC layer may be used. The TBC formed that includes the mischmetal oxide has a lower thermal conductivity than does YSZ.

The present invention is also a method for the application of oxide TBC that includes a mischmetal oxide to a superalloy turbine engine component including the steps of providing an electron beam physical vapor deposition apparatus, providing a turbine engine component comprising a surface to be coated, providing a first ingot that includes mischmetal oxide, and providing an second ingot comprising another oxide material selected from the group consisting of yttria-stablized zirconia, zirconia, yttria, hafnia, at least one other rare earth oxide, and combinations thereof. The component and the ingots are placed in the EB-PVD apparatus as known in the art. Melt pools are formed on the ingots as known in the art. Mischmetal oxide vapors and other oxide vapors are then dispersed as known in the art. The mischmetal oxide vapors and other oxide vapors are then deposited onto the surface to be coated. The deposition process forms a TBC having a thickness in the range of about 0.0025 inch to about 0.010 inch.

The present invention is also a method for the application of an oxide TBC that includes a mischmetal oxide to a superalloy turbine engine component including the steps of providing an electron beam physical vapor deposition apparatus, providing a turbine engine component comprising a surface to be coated, and providing an ingot that includes a mischmetal oxide. The component and the ingot are placed in the apparatus as known in the art. Melt pools are formed on the ingot as known in the art. Mischmetal oxide vapors are then dispersed as known in the art. The mischmetal oxide vapors are then deposited onto the surface to be coated. The deposition process forms a TBC having a thickness in the range of about 0.0025 inch to about 0.010 inch.

The present invention is also a method for the application of a TBC that includes a mischmetal oxide to a superalloy turbine engine component including the steps of providing an electron beam physical vapor deposition apparatus, providing a turbine engine component comprising a surface to be coated, and providing an ingot that includes mischmetal oxide and another oxide material selected from the group consisting of yttria-stablized zirconia, zirconia, yttria, hafnia, at least one other rare earth oxide, and combinations thereof. The component and the ingot are placed in the EB-PVD apparatus as known in the art. Melt pools are formed on the ingot by the electron beam as known in the art. Mischmetal oxide vapors and other oxide vapors are then dispersed as known in the art. The mischmetal oxide vapors and other oxide vapors are then deposited onto the surface to be coated. The deposition process forms a TBC having a thickness in the range of about 0.0025 inch to about 0.010 inch.

An advantage of the present invention is that the use of the rare earth oxides in the mischmetal oxide, which have lower thermal conductivity than yttria-stabilized zirconia, reduces the conductivity of the TBC, allowing a thinner TBC layer to be applied to the turbine engine component.

Another advantage of the present invention is erosion resistance of the TBC layer is improved through the use of the rare earth oxides in the mischmetal, which are believed to have at least comparable erosion resistance compared to yttria-stabilized zirconia.

Another advantage of the present invention is that the impact resistance of the TBC layer is improved through the use of the rare earth oxides in the mischmetal, which are believed to have at least comparable impact resistance compared to yttria-stabilized zirconia.

Another advantage of the present invention is that using a mischmetal or a mischmetal oxide ingot separate along with another oxide ingot permits intermittent co-evaporation, which allows the deposition of a TBC comprising a plurality of layers with different properties.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
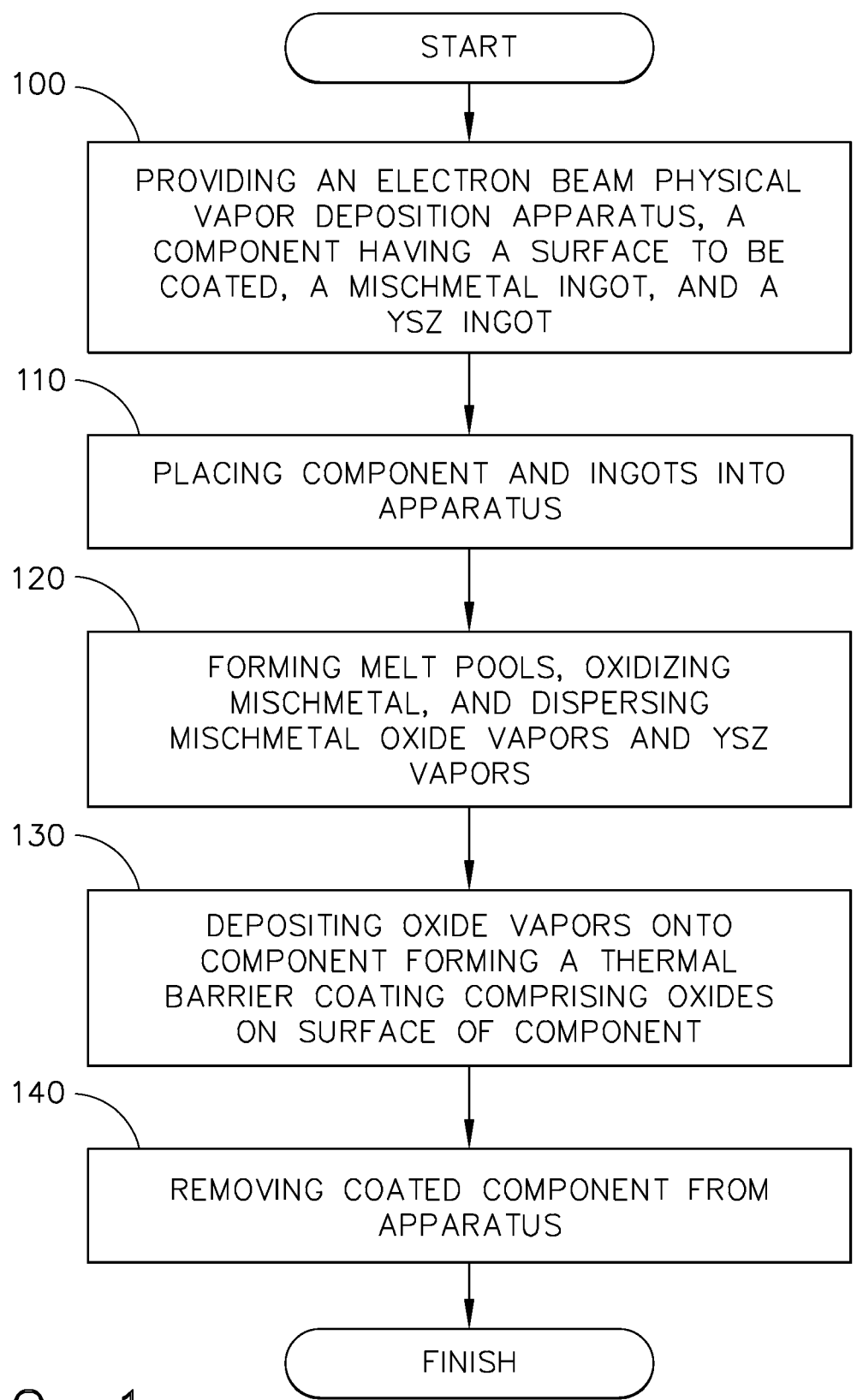
FIG. 1 is a flow chart illustrating a method of applying a mischmetal oxide TBC to a superalloy turbine engine component of the present invention.

Referring now to FIG. 1 there is shown the method of the present invention for applying a mischmetal oxide TBC to a superalloy turbine engine component of the present invention. The initial step 100 of the process comprises providing an EB-PVD apparatus, a superalloy turbine engine component comprising a surface to be coated, a first mischmetal ingot, and a second oxide ingot comprising another oxide material selected from the group consisting of yttria-stablized zirconia, zirconia, yttria, hafnia, at least one other rare earth oxide, and combinations thereof. The mischmetal ingot preferably comprises, based on 100% of weight, about 30% to about 70% Ce by weight, about 19% to about 56% La by weight, about 2% to about 7% Pr by weight and from about 0% to about 20% Nd by weight. The preferred mischmetal ingot may also contain impurities, such as iron and/or silicon. In a more preferred embodiment, the mischmetal ingot comprises, based on 100% of weight, about 30% to about 70% Ce by weight, about 19% to about 40% La by weight, about 2% to about 7% Pr by weight, about 0% to about 20% Nd by weight, and balance impurities. Ingots for EB-PVD processes are well known in the art. Such superalloy components may comprise nickel-based, iron-based, or cobalt-based superalloys as known in the art. The EB-PVD apparatus may be any such apparatus as known in the art. For example, the EB-PVD apparatus disclosed in U.S. Pat. No. 6,589,351 B1 can be used for the present invention. U.S. Pat. No. 6,589,351 B1, which is assigned to the assignee of the present invention, is incorporated by reference herein. The turbine engine component may be partially masked with an appropriate maskant to protect preselected surfaces from being coated as known in the art.

The next step 110 of the process is placing the component and the ingots into the apparatus as known in the art and drawing in oxygen as required to oxidize the mischmetal. The next step 120 of the process is forming melt pools on the ingots, oxidizing the mischmetal, and dispersing mischmetal oxide vapors and other oxide vapors. In a preferred embodiment, the molar percentage of the mischmetal oxide vapor includes up to about 14 percent of the total vapor. As oxygen is required to oxidize the mischmetal in the EB-PVD apparatus, if excess oxygen is provided to the process, that is more oxygen than is required to produce about 14 molar percent of mischmetal oxide, the EB-PVD process becomes difficult to control. The next step 130 of the process is co-depositing the mischmetal oxide vapors and other oxide vapors, preferably yttria-stabilized zirconia vapors, onto the surface to be coated, said deposition forming a thermal barrier coating having a thickness in the range of about 0.0025 inch to about 0.010 inch. In an optional embodiment, the co-deposition may be intermittent, where the electron beam is only directed at one ingot at a time. With intermittent co-deposition, the TBC may comprise a plurality of layers, wherein at least one layer comprises mischmetal oxide and at least one layer comprises the other oxide. In an alternate embodiment, the yttria-stabilized zirconia is in the range of about 4% yttria by weight to about 8% yttria by weight (4%–8% YSZ). In a more preferred alternate embodiment, the yttria-stabilized zirconia is about 7% yttria by weight (7% YSZ). 7% YSZ is well known in the art and is commonly used for TBC layers. The final step 140 of the process is removing the coated component from the apparatus.

Figure 2:
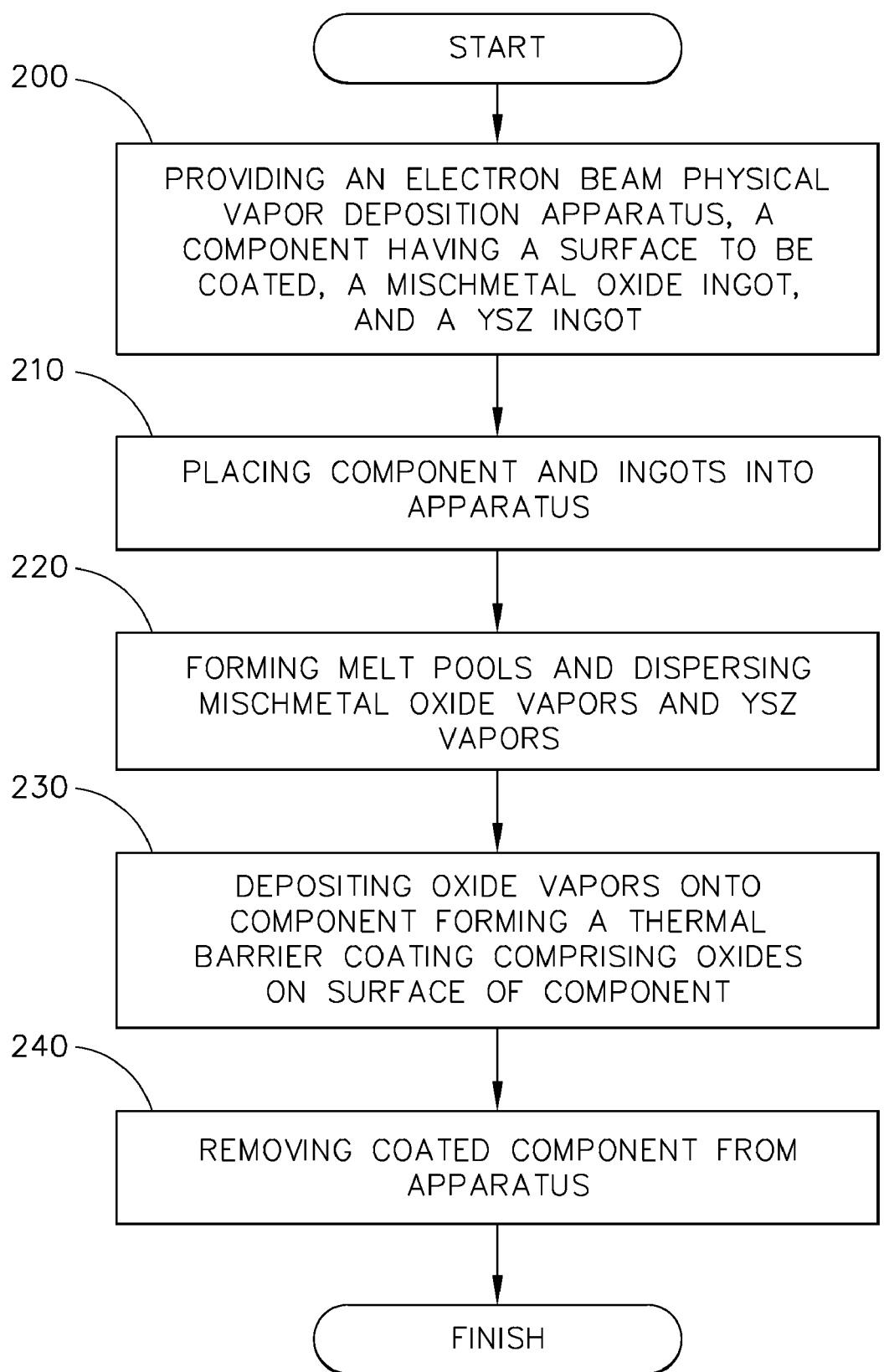
FIG. 2 a flow chart illustrating an alternative method of applying a mischmetal oxide TBC to a superalloy turbine engine component of the present invention.

Referring now to FIG. 2 there is shown an alternate method of the present invention for applying a mischmetal oxide TBC to a superalloy turbine engine component. The initial step 200 of the process comprises providing an EB-PVD apparatus, a superalloy turbine engine component comprising a surface to be coated, a first mischmetal oxide ingot, and an second ingot comprising another oxide material selected from the group consisting of yttria-stablized zirconia, zirconia, yttria, hafnia, at least one other rare earth oxide, and combinations thereof. The turbine engine component may be partially masked with an appropriate maskant as known in the art. The mischmetal which is oxidized to form the mischmetal oxide ingot preferably comprises, based on 100% of weight, about 30% to about 70% Ce by weight, about 19% to about 56% La by weight, about 2% to about 7% Pr by weight and from about 0% to about 20% Nd by weight. The preferred mischmetal, which is oxidized to produce the mischmetal oxide ingot, may also contain impurities. In a more preferred embodiment, the mischmetal, which is oxidized to produce the mischmetal oxide ingot, comprises, based on 100% of weight, about 30% to about 70% Ce by weight, about 19% to about 40% La by weight, about 2% to about 7% Pr by weight, about 0% to about 20% Nd by weight, and balance impurities.

The next step 210 of the process is placing the component and the ingots into the apparatus as known in the art and drawing a vacuum within the apparatus. The next step 220 of the process is forming melt pools on the ingots and dispersing mischmetal oxide vapors and other oxide vapors. The next step 230 of the process is co-depositing the mischmetal oxide vapors and the other oxide vapors onto the surface to be coated, the co-deposition forming a thermal barrier coating having a thickness in the range of about 0.0025 inch to about 0.010 inch. In an optional embodiment, the co-deposition may be intermittent, where the electron beam is only directed at one ingot at a time. With intermittent co-deposition, the TBC may comprise a plurality of layers, wherein at least one layer comprises mischmetal oxide and at least one layer comprises the other oxide. In a preferred embodiment, the other oxide is 4%–8% YSZ. In a more preferred embodiment, the other oxide is 7% YSZ, with the TBC comprising, based on 100% of weight, up to about 20% ceria by weight, up to about 30% lanthanum oxide by weight, up to about 7% praseodymium oxide by weight, up to about 20 percent neodymium oxide by weight, and balance YSZ. The TBC may also contain impurities. A weight percentage of ceria in the TBC above about 20 percent reduces the erosion resistance of the TBC. The final step 240 of the process is removing the coated component from the apparatus.

Figure 3:
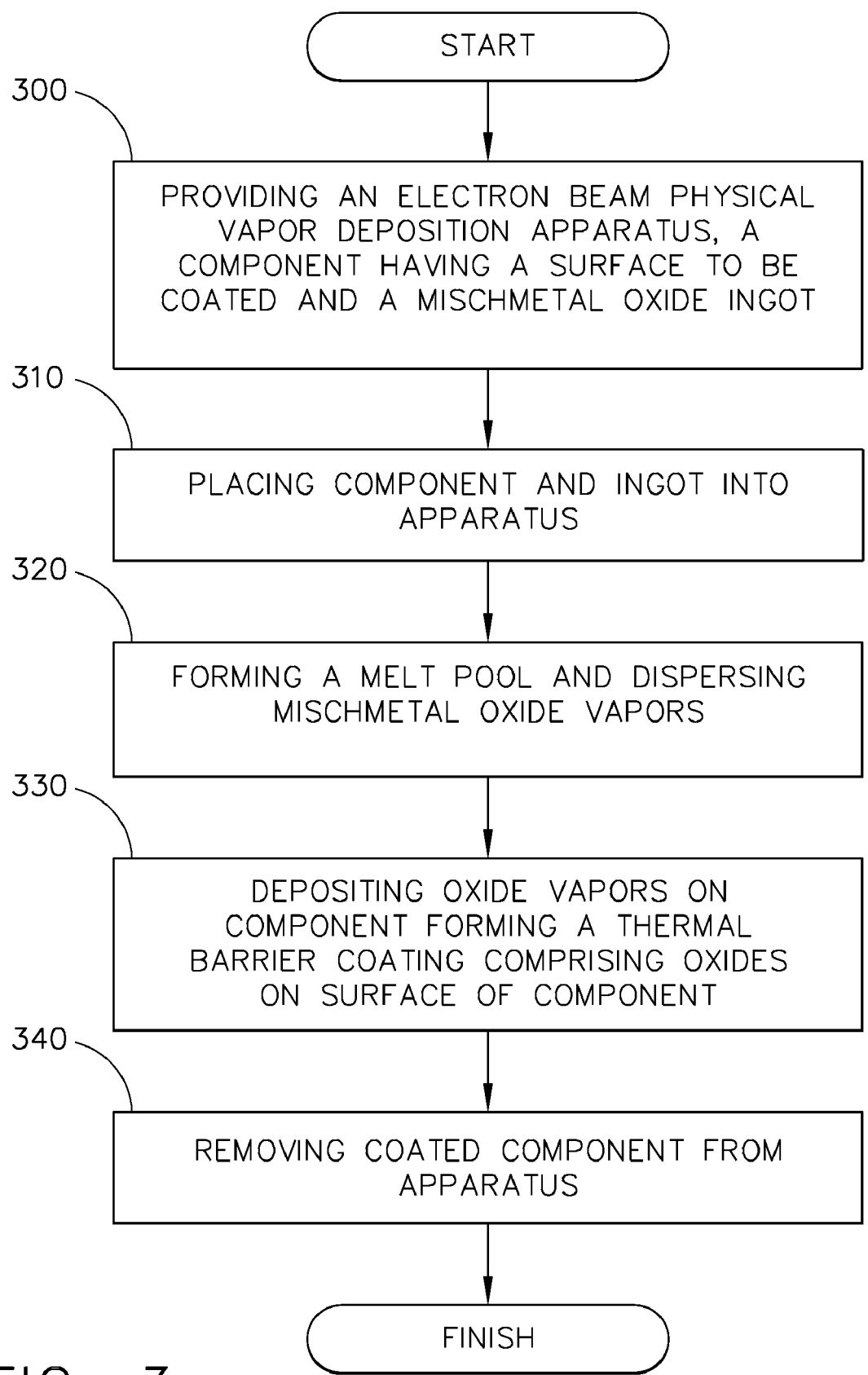
FIG. 3 is a flow chart illustrating another alternative method of applying a mischmetal oxide TBC to a superalloy turbine engine component of the present invention.

Referring now to FIG. 3 there is shown another alternate method of the present invention for applying of applying a mischmetal oxide TBC to a superalloy turbine engine component. The initial step 300 of the process comprises providing an EB-PVD apparatus, a superalloy turbine engine component comprising a surface to be coated, and a mischmetal oxide ingot. The turbine engine component may be partially masked with an appropriate maskant to protect preselected surfaces from being coated as known in the art.

The mischmetal which is oxidized to form the mischmetal oxide ingot preferably comprises, based on 100% of weight, about 30% to about 70% Ce by weight, about 19% to about 56% La by weight, about 2% to about 7% Pr by weight and from about 0% to about 20% Nd by weight. The preferred mischmetal, which is oxidized to produce the mischmetal oxide ingot, may also contain impurities. In a more preferred embodiment, the mischmetal, which is oxidized to produce the mischmetal oxide ingot, comprises, based on 100% of weight, about 30% to about 70% Ce by weight, about 19% to about 40% La by weight, about 2% to about 7% Pr by weight, about 0% to about 20% Nd by weight, and balance impurities.

The next step 310 of the process is placing the component and the ingot into the apparatus and drawing a vacuum within the apparatus as known in the art. The next step 320 of the process is forming a melt pool on the ingot and dispersing mischmetal oxide vapors. The next step 330 of the process is depositing the mischmetal oxide vapors onto the surface to be coated, said deposition forming a thermal barrier coating having a thickness in the range of about 0.0025 inch to about 0.010 inch. The mischmetal which is oxidized to form the mischmetal oxide ingot preferably comprises, based on 100% of weight, about 30% to about 70% Ce by weight, about 19% to about 56% La by weight, about 2% to about 7% Pr by weight and from about 0% to about 20% Nd by weight. The preferred mischmetal, which is oxidized to produce the mischmetal oxide ingot, may also contain impurities. In a more preferred embodiment, the mischmetal, which is oxidized to produce the mischmetal oxide ingot, comprises, based on 100% of weight, about 30% to about 70% Ce by weight, about 19% to about 40% La by weight, about 2% to about 7% Pr by weight, about 0% to about 20% Nd by weight, and balance impurities. The final step 340 of the process is removing the coated component from the apparatus.

Figure 4:
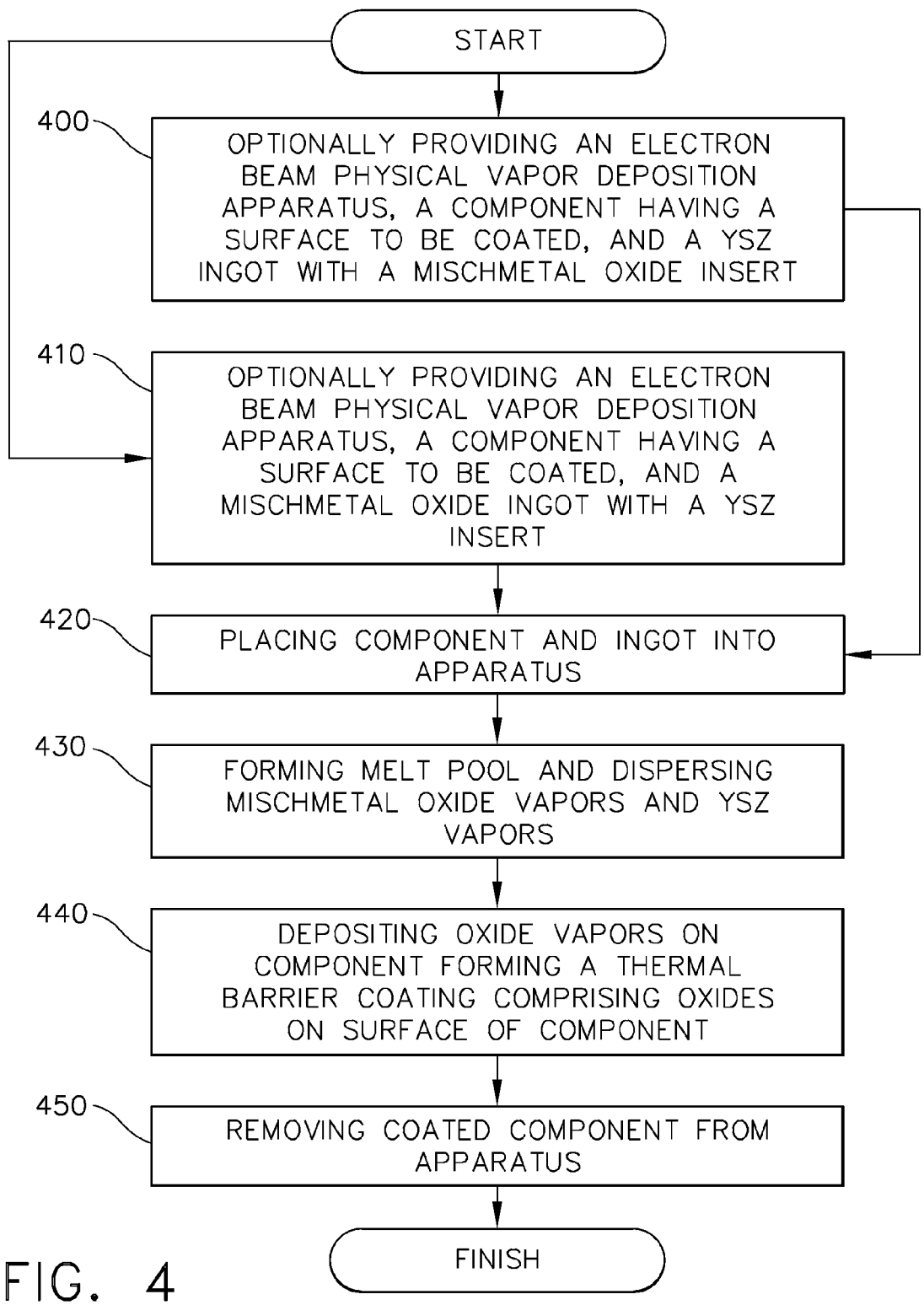
FIG. 4 is a flow chart illustrating another alternative method of applying a mischmetal oxide TBC to a superalloy turbine engine component of the present invention.

Referring now to FIG. 4 there is shown yet another alternate method of the present invention for applying of applying a mischmetal oxide TBC to a superalloy turbine engine component. The optional initial step 400 of the process is the provision of an EB-PVD apparatus, a superalloy turbine engine component comprising a surface to be coated, and an oxide ingot comprising a mischmetal oxide insert and another oxide material selected from the group consisting of yttria-stablized zirconia, zirconia, yttria, hafnia, at least one other rare earth oxide, and combinations thereof. The other optional initial step 410 of the process comprises providing an EB-PVD apparatus, a superalloy turbine engine component comprising a surface to be coated, and a mischmetal oxide ingot comprising another oxide insert comprising another oxide material selected from the group consisting of yttria-stablized zirconia, zirconia, yttria, hafnia, at least one other rare earth oxide, and combinations thereof. The turbine engine component may be partially masked with an appropriate maskant to protect preselected surfaces from being coated as known in the art. The oxide ingot preferably comprises, based on 100% of weight, up to about 20% ceria by weight, up to about 30% lanthanum oxide by weight, up to about 7% praseodymium oxide by weight, up to about 20 percent neodymium oxide by weight, and balance other oxides. The oxide ingot may contain impurities.

The next step 420 of the process is placing the component and the ingot into the apparatus as known in the art. The next step 430 of the process is forming a melt pool on the ingot including both the mischmetal oxide and other oxide, and dispersing mischmetal oxide vapors and other oxide vapors. The next step 440 of the process is co-depositing the mischmetal oxide vapors and the other oxide vapors onto the surface to be coated, said co-deposition forming a thermal barrier coating having a thickness in the range of about 0.0025 inch to about 0.010 inch. In a preferred embodiment, the other oxide is 4%–8% YSZ. In a more preferred embodiment, the yttria-stabilized zirconia is 7% YSZ, with the TBC comprising, based on 100% of weight, up to about 20% ceria by weight, up to about 30% lanthanum oxide by weight, up to about 7% praseodymium oxide by weight, up to about 20 percent neodymium oxide by weight, and balance YSZ. The TBC may also contain impurities. The final step 450 of the process is removing the coated component from the apparatus.

Figure 5:
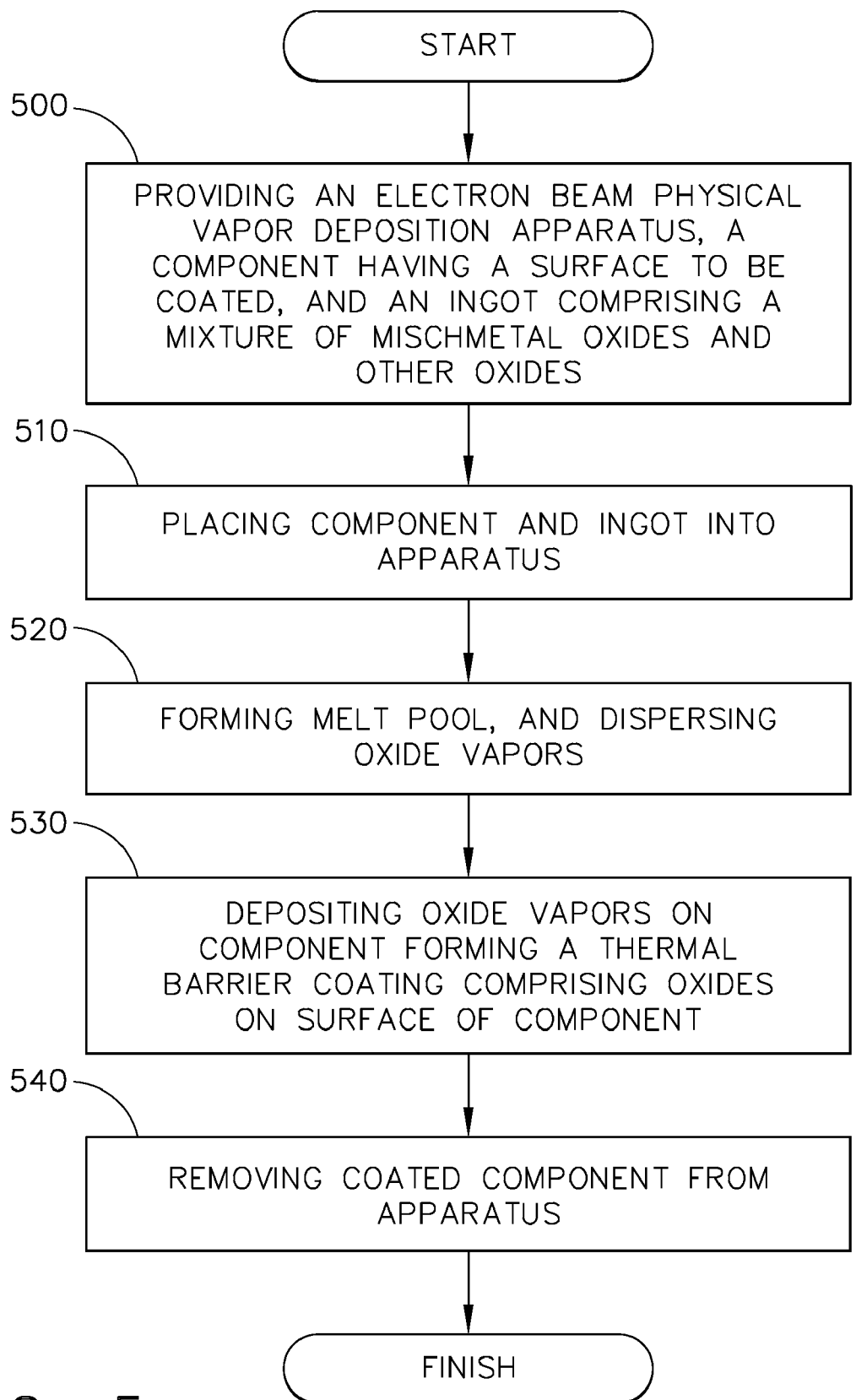
FIG. 5 is a flow chart illustrating another alternative method of applying a TBC comprising mischmetal oxide to a superalloy turbine engine component.

Referring now to FIG. 5 there is shown yet another alternate method of the present invention for applying of applying a TBC comprising mischmetal oxide to a superalloy turbine engine component. The initial step 500 of the process comprises providing an EB-PVD apparatus, a superalloy turbine engine component comprising a surface to be coated, and an oxide ingot comprising a mixture of mischmetal oxide powder and another oxide powder selected from the group consisting of yttria-stablized zirconia, zirconia, yttria, hafnia, at least one other rare earth oxide, and combinations thereof. The oxide ingot comprising mischmetal oxide powder and another oxide powder may have been manufactured by processing mischmetal ore to form mischmetal oxide powder as known in the art followed by forming the mischmetal oxide powder and the other oxide, in the form of a powder, into an oxide ingot. The oxide ingot preferably comprises, based on 100% of weight, up to about 20% ceria by weight, up to about 30% lanthanum oxide by weight, up to about 7% praseodymium oxide by weight, up to about 20 percent neodymium oxide by weight, and balance other oxides. The oxide ingot may contain impurities. The turbine engine component may be partially masked with an appropriate maskant to protect preselected surfaces from being coated as known in the art.

The next step 510 of the process is placing the component and the ingot into the apparatus and drawing a vacuum within the apparatus as known in the art. The next step 520 of the process is forming a melt pool on the ingot and dispersing oxide vapors. The next step 530 of the process is co-depositing the mischmetal oxide vapors and the other oxide vapors onto the surface to be coated, said co-deposition forming a thermal barrier coating having a thickness in the range of about 0.0025 inch to about 0.010 inch. In a preferred embodiment, the other oxide is 4%–8% YSZ. In a more preferred embodiment, the other oxide is 7% YSZ, with the TBC comprising, based on 100% of weight, up to about 20% ceria by weight, up to about 30% lanthanum oxide by weight, up to about 7% praseodymium oxide by weight, up to about 20 percent neodymium oxide by weight, and balance YSZ. The TBC may also contain impurities. The final step 540 of the process is removing the coated component from the apparatus.

Figure 6:
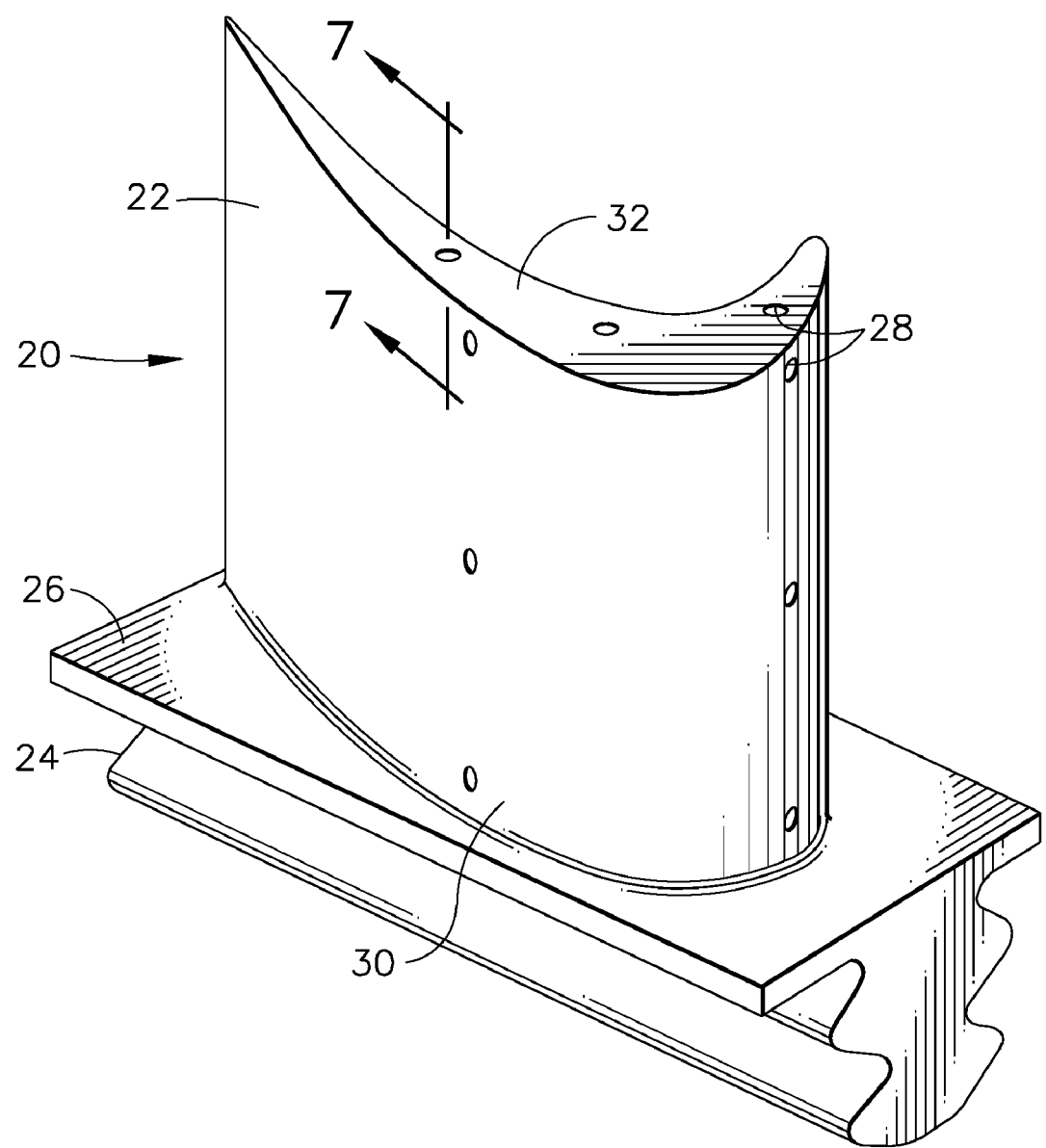
FIG. 6 is a perspective view of a typical turbine blade.

FIG. 6 depicts a component article of a turbine engine such as a turbine blade or turbine vane, and in this illustration a turbine blade 20 coated with a bond coat layer, an alumina scale layer and a mischmetal oxide TBC layer of the present invention. The turbine blade 20 is formed of any operable substrate material, and is preferably an iron, nickel or cobalt-base superalloy (or combinations thereof). The turbine blade 20 includes an airfoil 22 against which the flow of hot exhaust gas is directed. The turbine blade 20 is mounted to a turbine disk (not shown) by a dovetail 24 that extends downwardly from the airfoil 22 and engages a slot on the turbine disk. A platform 26 extends longitudinally outward from the area where the airfoil 22 is joined to the dovetail. A number of internal cooling passages extend through the interior of the airfoil 22, ending in openings 28 in the surface of the airfoil 22. A flow of cooling air is directed through the internal cooling passages, to reduce the temperature of the airfoil 22. The airfoil may be described as having a root end 30 adjacent to the dovetail 24, and an oppositely disposed tip end 32 remote from the dovetail 24.

Figure 7:
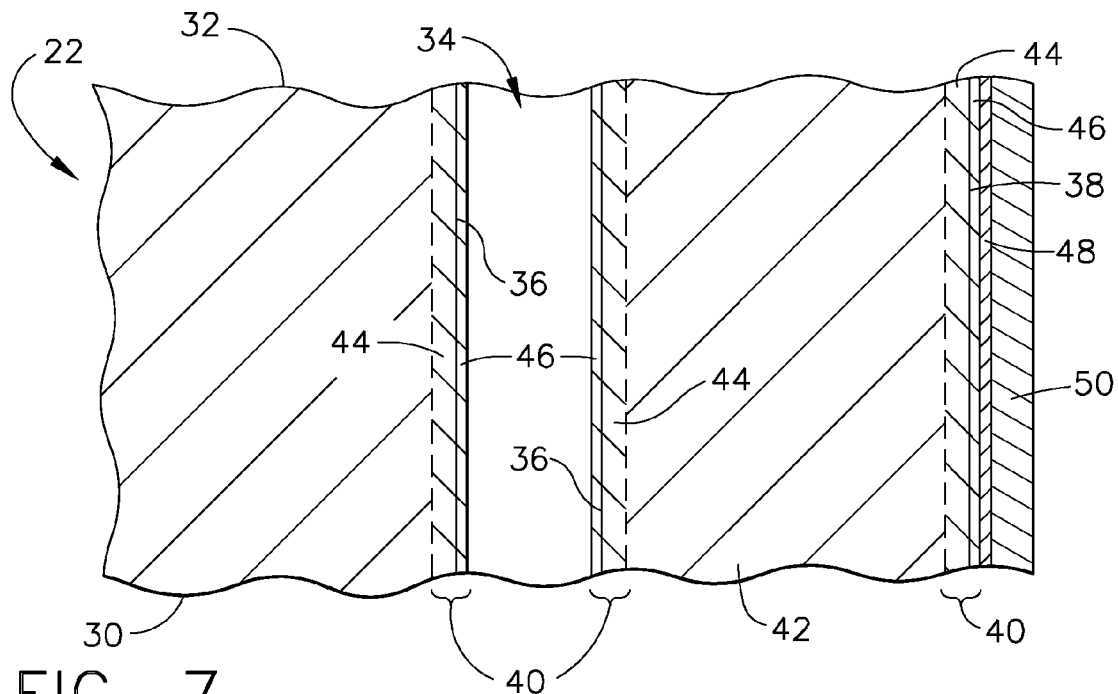
FIG. 7 is a cross-sectional view of a the turbine blade of FIG. 6 through a cooling channel with the TBC layer comprising mischmetal oxide of the present invention applied to the outer surface.

FIG. 7 is a longitudinal section through the airfoil 22, showing one of the internal cooling passages 34 extending through an interior of the airfoil 22. The internal cooling passage 34 has an internal surface 36, and there is also an external airfoil surface 38 of the metallic portion of the airfoil 22.

An optional diffusion aluminide protective layer 40 is formed on the airfoil surfaces 36, 38. The diffusion aluminide is formed by depositing and diffusing aluminum onto and into the passageways and external to the airfoil where it deposits onto and into the substrate material 42 of the airfoil 22. The aluminum is interdiffused with the material of the substrate 42 to form the aluminum-enriched protective layer 40 lying above and below the airfoil surfaces 36, 38, forming an internal diffusion aluminide layer 44 and a topical diffusion aluminide layer 46. The diffusion aluminide protective layer 40 has a composition with the aluminum concentration highest near and above the airfoil surfaces 36, 38, and decreasing aluminum concentration with increasing distance into the substrate 42 from the airfoil surfaces 36, 38. The diffusion aluminide protective layer 40 is typically from about 0.0005 inch to about 0.005 inch thick and also functions as a bond coat. When exposed to a high-temperature oxidizing environment, the topical diffusion aluminide layer 46 at the external airfoil surface 38 oxidizes to form a highly adherent alumina protective scale 48, inhibiting and slowing further oxidation damage. The aluminum-enriched layer serves as a reservoir to heal any loss of aluminum during normal operation.

Such diffusion aluminide protective layers 40, which function as bond coats, and alumina scales 48 are generally known in the art, although specific compositions may not be known. A TBC 50 comprising mischmetal oxide is deposited on top of and bonded to the alumina scale 48 to provide additional thermal protection for the airfoil 22. The TBC 50, which comprises mischmetal oxide, is about 0.0025 to about 0.010 inch thick. The TBC may also comprise another oxide material selected from the group consisting of yttria-stablized zirconia, zirconia, yttria, hafnia, at least one other rare earth oxide, and combinations thereof. In a preferred embodiment, the TBC 50 comprises, based on 100% of weight, up to about 20% ceria by weight, up to about 30% lanthanum oxide by weight, up to about 7% praseodymium oxide by weight, up to about 20 percent neodymium oxide by weight, and balance other oxides. The TBC 50 may also contain impurities. In an alternative preferred embodiment, the oxide material is 4%–8% YSZ. In a more preferred embodiment, the oxide material is 7% YSZ and the TBC 50 comprises, based on 100% of weight, up to about 20% ceria by weight, up to about 30% lanthanum oxide by weight, up to about 7% praseodymium oxide by weight, up to about 20 percent neodymium oxide by weight, and balance other oxides. The TBC 50 may also contain impurities.

Figure 8:
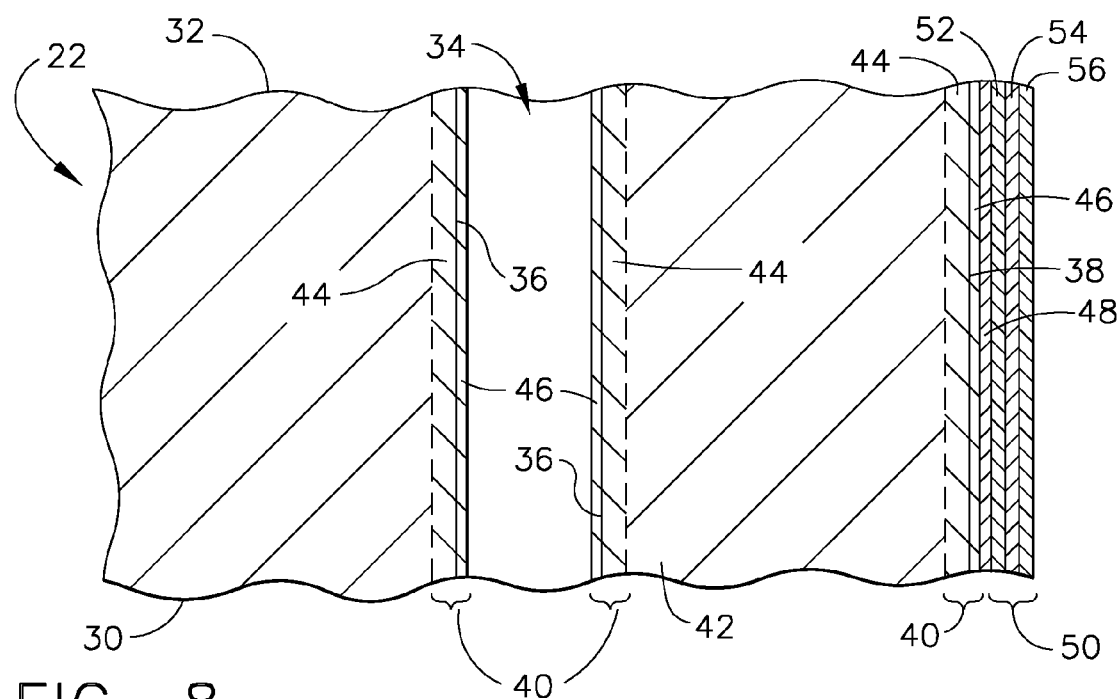
FIG. 8 is a cross-sectional view of a the turbine blade of FIG. 6 through a cooling channel with the TBC layer comprising a plurality of layers, at least one layer of which comprises mischmetal oxide of the present invention, applied to the outer surface.

FIG. 8 is an alternative embodiment showing a longitudinal section through the airfoil 22, showing one of the internal cooling passages 34 extending through an interior of the airfoil 22. The internal cooling passage 34 has an internal surface 36, and there is also an external airfoil surface 38 of the metallic portion of the airfoil 22.

An optional diffusion aluminide protective layer 40 is formed on the airfoil surfaces 36, 38. The diffusion aluminide is formed by depositing and diffusing aluminum onto and into the passageways and external to the airfoil where it deposits onto and into the substrate material 42 of the airfoil 22. The aluminum is interdiffused with the material of the substrate 42 to form the aluminum-enriched protective layer 40 lying above and below the airfoil surfaces 36, 38, forming an internal diffusion aluminide layer 44 and a topical diffusion aluminide layer 46. The diffusion aluminide protective layer 40 has a composition with the aluminum concentration highest near and above the airfoil surfaces 36, 38, and decreasing aluminum concentration with increasing distance into the substrate 42 from the airfoil surfaces 36, 38. The diffusion aluminide protective layer 40 is typically from about 0.0005 inch to about 0.005 inch thick and also functions as a bond coat. When exposed to a high-temperature oxidizing environment, the topical diffusion aluminide layer 46 at the external airfoil surface 38 oxidizes to form a highly adherent alumina protective scale 48, inhibiting and slowing further oxidation damage. The aluminum-enriched layer serves as a reservoir to heal any loss of aluminum during normal operation.

Such diffusion aluminide protective layers 40 and alumina scales 48 are generally known in the art, although specific compositions may not be known. A TBC 50 comprises a plurality of TBC layers 52, 54, 56 overlying one another. A bottom layer 52, which serves to bond the TBC 50 to the alumina scale 48, comprises an oxide material selected from the group consisting of yttria-stablized zirconia, zirconia, yttria, hafnia, at least one other rare earth oxide, and combinations thereof. The bottom layer is preferably 4%–8% YSZ, and more preferably 7% YSZ. A middle layer 54, which simply functions as a portion of the TBC 50, overlies the bottom layer 52 and comprises mischmetal oxide. A top layer 56, which serves as an erosion layer, overlies the middle layer 54 and comprises an oxide material selected from the group consisting of yttria-stablized zirconia, zirconia, yttria, hafnia, at least one other rare earth oxide, and combinations thereof. The bottom layer is preferably 4%–8% YSZ, and more preferably 7% YSZ. Although three TBC layers 52, 54, 56 are shown in FIG. 8, the there may be two TBC layers or more than three TBC layers. The TBC 50 is deposited on top of and bonded to the alumina scale 48 to provide additional thermal protection for the airfoil 22. The TBC 50 is about 0.0025 to about 0.010 inch thick. In a preferred embodiment, the TBC 50 comprises, based on 100% of weight, up to about 20% ceria by weight, up to about 30% lanthanum oxide by weight, up to about 7% praseodymium oxide by weight, up to about 20 percent neodymium oxide by weight, and balance other oxides. The TBC 50 may also contain impurities While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A turbine engine component comprising:
a superalloy substrate;
a bond coat on the superalloy substrate having a thickness in the range of about 0.0005 inch to about 0.005 inch;
an alumina scale overlying the bond coat; and
a thermal barrier coating overlying the alumina scale having a thickness in the range of about 0.0025 inch to about 0.010 inch, comprising at least mischmetal oxide.

2. The turbine engine component of claim 1, wherein the thermal barrier coating also comprises another oxide material selected from the group consisting of yttria-stablized zirconia, zirconia, yttria, hafnia, at least one other rare earth oxide, and combinations thereof.

3. The turbine engine component of claim 2, wherein the oxide material is yttria-stabilized zirconia and wherein the percentage of yttria in the yttria-stabilized zirconia is in the range of 4% to 8% yttria by weight.

4. The turbine engine component of claim 3, wherein the oxide material is yttria-stabilized zirconia, wherein the percentage of yttria is about 7% yttria by weight, and wherein the thermal barrier coating comprises, based on 100% of weight, up to about 20% ceria by weight, up to about 30% lanthanum oxide by weight, up to about 7% praseodymium oxide by weight, up to about 20 percent neodymium oxide by weight, and balance yttria-stabilized zirconia.

5. The turbine engine component of claim 2, wherein the thermal barrier coating does not contain any yttria-stabilized zirconia.

6. The turbine engine component of claim 3, wherein the thermal barrier coating comprises, based on 100% of weight, up to about 20% ceria by weight, up to about 30% lanthanum oxide by weight, up to about 7% praseodymium oxide by weight, up to about 20 percent neodymium oxide by weight, and balance yttria-stabilized zirconia.

7. The turbine engine component of claim 1, wherein the thermal barrier coating comprises a bottom layer, a middle layer overlying the bottom layer, and a top layer overlying the middle layer.

8. The turbine engine component of claim 7, wherein the bottom layer is 7% YSZ, the middle layer is mischmetal oxide, and the top layer is 7% YSZ.

* * * * *